(12) United States Patent
Sandhu

(10) Patent No.: US 7,452,759 B2
(45) Date of Patent: Nov. 18, 2008

(54) CARBON NANOTUBE FIELD EFFECT TRANSISTOR AND METHODS FOR MAKING SAME

(75) Inventor: Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 403 days.

(21) Appl. No.: 11/288,816

(22) Filed: Nov. 29, 2005

(65) Prior Publication Data

US 2007/0122986 A1    May 31, 2007

(51) Int. Cl.
*H01L 21/84* (2006.01)
(52) U.S. Cl. .............. 438/151; 438/300; 257/E21.621; 977/842; 977/938
(58) Field of Classification Search .............. 977/936, 977/938
See application file for complete search history.

(56) References Cited

U.S. PATENT DOCUMENTS

| | | | |
|---|---|---|---|
| 6,821,911 B1 * | 11/2004 | Lo et al. | 438/780 |
| 6,972,467 B2 * | 12/2005 | Zhang et al. | 257/401 |
| 7,132,714 B2 * | 11/2006 | Bae et al. | 257/329 |
| 2005/0271648 A1 * | 12/2005 | Sugiyama | 424/125 |
| 2007/0018228 A1 * | 1/2007 | Sandhu et al. | 257/315 |
| 2008/0026534 A1 * | 1/2008 | Avouris et al. | 438/301 |

OTHER PUBLICATIONS

U.S. Appl. No. 11/195,433, filed Aug. 2, 2005, Sandhu.

I. Radu et al., "Oriented Growth of Single-Wall Carbon Nanotubes Using Alumina Patterns," Nanotechnology, vol. 15, pp. 473-476 (Feb. 2, 2004).

S. Li et al., "Silicon Nitride Gate Dielectric for Top-Gated Carbon Nanotube Field Effect Transistors," J. Vac. Sci. Technol. B, vol. 22, No. 6, pp. 3112-3114 (Dec. 10, 2004).

A. Yu, "A Study of Carbon Nanotubes and Their Applications in Transistors," School of Electrical and Computer Engineering, 1-32 (May 17, 2004) (published at http://132.236.67.210/engrc350/ingenuity/Yu_A_paper_issue_3.pdf).

"Carbon Nanotubes and Nanotube Transistors," ECE497NC Lecture 14, 1-9 (Mar. 10, 2004) (published at http://www.crhc.uiuc.edu/ece497nc/scribe/nanotube1.pdf).

A. Javey et al., "Carbon Nanotube Field-Effect Transistors with Integrated Ohmic Contacts and High-K Gate Dielectrics," Nano Letters, vol. 4, No. 3, pp. 447-450 (Feb. 20, 2004).

(Continued)

Primary Examiner—Stephen W Smoot
(74) Attorney, Agent, or Firm—Wong Cabello Lutsch Rutherford & Brucculeri, LLP

(57) ABSTRACT

A structure and fabrication process for a carbon nanotube field effect transistor is disclosed herein. In one embodiment, a method for forming a carbon nanotube transistor starts with a substrate comprised of a bottom dielectric, a carbon nanotube layer, and a top dielectric. A pillar is formed on the top dielectric, and a sidewall gate is formed on a sidewall of the pillar. A source is formed proximate to an outer edge of the gate and in contact with the carbon nanotube layer. The pillar is then removed, the source area masked, and a drain is formed proximate to an inner edge of the gate and in contact with the carbon nanotube layer. The source and drain are self aligned to the gate as dictated by the placement of dielectric spacers on the inner and outer edges of the gate.

17 Claims, 5 Drawing Sheets

OTHER PUBLICATIONS

S. Heinze et al., "Electrostatic Engineering of Nanotube Transistors for Improved Performance," Applied Physics Letters, vol. 83, No. 24, pp. 5038-5040 (Dec. 15, 2003).

A. Javey, et al., "Advancements in Complementary Carbon Nanotube Field-Effect Transistors," IEDM Tech. Digest., pp. 741-774 (2003).

J. Guo, et al., "Performance Projections for Ballistic Carbon Nanotube Field-Effect Transistors," Applied Physics Letters, vol. 80, No. 17, pp. 3192-3194 (Apr. 29, 2002).

X. Liu, et al., "Carbon Nanotube Field-Effect Inverters," Applied Physics Letters, vol. 79, No. 20, pp. 3329-3331 (Nov. 12, 2001).

R. Martel, et al., "Single- and Multi-Wall Carbon Nanotube Field-Effect Transistors," Applied Physics Letters, vol. 73, No. 17, pp. 2447-2449 (Oct. 26, 1998).

Jae-Hong Park et al., "Screen Printed Carbon Nanotube Field Emitter Array for Lighting Source Application," Technical Digest of the 17th International Vacuum Nanoelectronics Conference 2004, pp. 142-143 (Jul. 11-16, 2004).

B.J.C. Thomas et al, "Multi-Walled Carbon Nanotube Coatings Using Electrophoretic Deposition (EPD)," J. Am. Ceramic Soc'y, vol. 88(4), p. 980 (Apr. 2005).

* cited by examiner

CARBON NANOTUBE FIELD EFFECT TRANSISTOR AND METHODS FOR MAKING SAME

FIELD OF THE INVENTION

Embodiments of this invention relate to transistors, and specifically to field effect transistors using carbon nanotubes as the conduction media between the source and the drain.

BACKGROUND

High performance Carbon Nanotube (CNT) Field Effect Transistors (FETs) have been demonstrated in the art. See, for example, the following references, which are all incorporated herein by reference: I. Radu et al., "Oriented Growth of Single-Wall Carbon Nanotubes Using Alumina Patterns," Nanotechnology, Vol. 15, pp. 473-476 (Feb. 2, 2004); S. Li et al., "Silicon Nitride Gate Dielectric for Top-Gated Carbon Nanotube Field Effect Transistors," J. Vac. Sci. Technol. B, Vol. 22, No. 6, pp. 3112-3114 (Dec. 10, 2004); A. Yu, "A Study of Carbon Nanotubes and Their Applications in Transistors," School of Electrical and Computer Engineering, 1-32 (May 17, 2004) (published at http://132.236.67.210/engrc350/ingenuity/Yu_A_paper_issue_3.pdf); "Carbon Nanotubes and Nanotube Transistors," ECE497NC Lecture 14, 1-9 (Mar. 10, 2004) (published at http://www.crhc.uiuc.edu/ece497nc/scribe/nanotube1.pdf); A. Javey et al., "Carbon Nanotube Field-Effect Transistors with Integrated Ohmic Contacts and High-K Gate Dielectrics," Nano Letters, Vol. 4, No. 3, pp. 447-450 (Feb. 20, 2004); S. Heinze et al., "Electrostatic Engineering of Nanotube Transistors for Improved Performance," Applied Physics Letters, Vol. 83, No. 24, pp. 5038-5040 (Dec. 15, 2003); A. Javey et al., "Advancements in Complementary Carbon Nanotube Field-Effect Transistors," IEDM Tech. Digest., pp. 741-74 (2003); J. Guo et al., "Performance Projections for Ballistic Carbon Nanotube Field-Effect Transistors," Applied Physics Letters, Vol. 80, No. 17, pp. 3192-3194 (Apr. 29, 2002); X. Liu et al., "Carbon Nanotube Field-Effect Inverters," Applied Physics Letters, Vol. 79, No. 20, pp. 3329-3331 (Nov. 12, 2001); R. Martel et al., "Single- and Multi-Wall Carbon Nanotube Field-Effect Transistors," Applied Physics Letters, Vol. 73, No. 17, pp. 2447-2449 (Oct. 26, 1998).

As these prior approaches make clear, a CNT FET, like a traditional FET, comprises a gate, a source, and a drain. A carbon nanotube, or a plurality of carbon nanotubes, span(s) lengthwise between the source and the drain such that an end of each tube(s) is in contact with the drain and source. Accordingly, the carbon nanotube(s) comprise(s) the conductive media or "channel" for the CNT FET. It is generally believed that gating of the channel occurs by modulation of the barrier heights of the junctions between the carbon nanotubes and the metallic source/drain regions.

Some CNT FETs as published in the art are somewhat hypothetical or prophetic in nature. That is, some are discussed at a theoretical level without any or proper consideration of the processes that might be used to fabricate the CNT FET. Moreover, other CNT FETs as published use processes which are not manufacturable at high densities or which employ somewhat exotic processing techniques. The lack of an efficient, inexpensive, and dense CNT FET manufacturing process will hamper the growth and utility of CNT technology for leading-edge integrated circuit products.

Hence, it is a goal of the disclosure to provide a manufacturing process for forming CNT FETs that uses standard semiconductor processing techniques; that provides a dense structure commensurate with minimum linewidth lithography; and that is well adapted for use in logic and memory circuitry.

SUMMARY

A structure and fabrication process for a carbon nanotube field effect transistor is disclosed herein. In one embodiment, a method for forming a carbon nanotube transistor starts with a substrate comprised of a bottom dielectric, a carbon nanotube layer, and a top dielectric. A pillar is formed on the top dielectric, and a sidewall gate is formed on a sidewall of the pillar. A source is formed proximate to an outer edge of the gate and in contact with the carbon nanotube layer. The pillar is then removed, the source area masked, and a drain is formed proximate to an inner edge of the gate and in contact with the carbon nanotube layer. The source and drain are self aligned to the gate as dictated by the placement of dielectric spacers on the inner and outer edges of the gate.

BRIEF DESCRIPTION OF THE DRAWINGS

Embodiments of the inventive aspects of this disclosure will be best understood with reference to the following detailed description, when read in conjunction with the accompanying drawings, in which.

DETAILED DESCRIPTION

As alluded to above, disclose herein is the structure and manufacturing process for a CNT FET. As will be seen, the disclosed manufacturing technique is dense, uses largely standard semiconductor processes, and is easily employed in the formation of logic and memory circuits.

Figure 1:
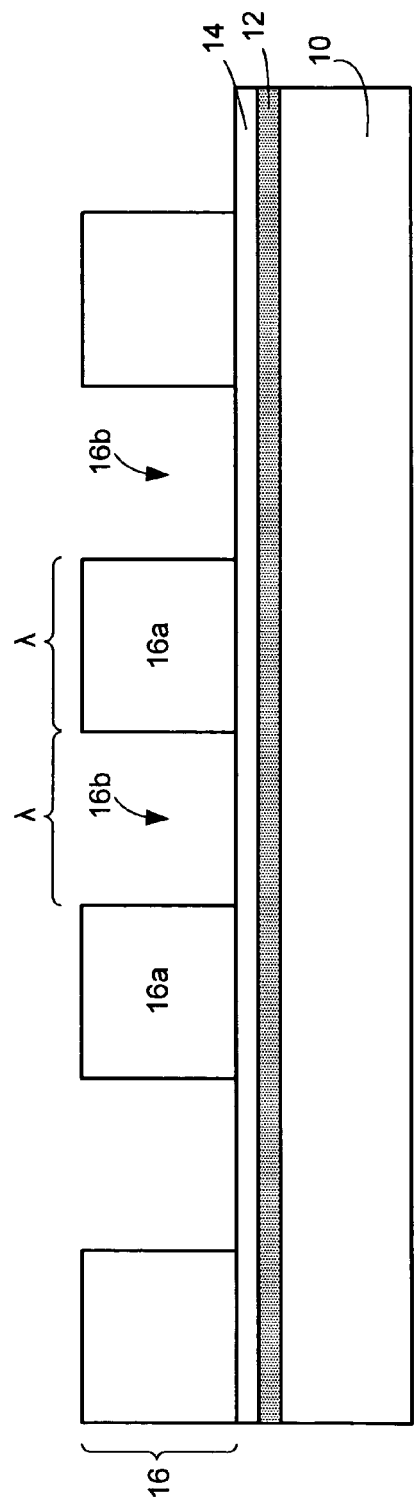
FIGS. 1 through 8 illustrate sequential steps in the fabrication of CNT FETs.

An embodiment of the manufacturing process starts with reference to the cross sectional view of FIG. 1. Shown is substrate 10 as coated with a CNT layer 12. In a preferred embodiment, the substrate 10 is insulative, and can comprise a silicon dioxide ("oxide") for example. Such an oxide substrate 10 can comprise an oxide deposited on a silicon substrate, the insulative layer of a silicon-on-insulator (SOI) wafer, a solid insulative substrate such as a sapphire substrate, etc. Other insulative materials could be used for substrate 10 as well, e.g., silicon nitride ("nitride").

The CNT layer 12 in a preferred embodiment is placed on the substrate 10 using a spin on process. See, e.g., Jae-Hong Park et al., "Screen Printed Carbon Nanotube Field Emitter Array for Lighting Source Application," Technical Digest of the 17th International Vacuum Nanoelectronics Conference 2004, pp. 142-143 (Jul. 11-16, 2004), which is incorporated herein by reference. The thickness of this coating is preferably substantially less than the length of the carbon nanotubes such that when the solvent is spun on the substrate, the carbon nanotubes will tend to lay flat, i.e., with their axes substantially parallel to the plane of the substrate 10. Then, the coating is baked to remove the solvent, leaving the carbon nanotubes in a random yet flat arrangement. This process is illustrated further in U.S. patent application Ser. No. 11/195,433, filed Aug. 2, 2005 ("the '433 application"), which is incorporated by reference in its entirety. Of course, other methods could be used to form the CNT layer 12 as well, such as CVD plasmas, electrophoretic deposition, etc. See, e.g., B.

J. C. Thomas et al, "Multi-Walled Carbon Nanotube Coatings Using Electrophoretic Deposition (EPD)," J. Am. Ceramic Soc'y, Vol. 88(4), pg. 980 (April 2005), which is incorporated herein by reference. Ultimately the method used to deposit the CNT layer 12 is not critically important to the transistor design or methods disclosed herein.

After CNT layer 12 is formed, an insulative layer 14 is formed thereover (not shown to scale in the Figures). In a preferred embodiment, insulative layer 14 comprises an oxide, but could comprise other dielectric materials as well. As will be seen, insulative layer 14 comprises the gate oxide of the CNT FET to be formed.

Next, a nitride layer 16 is formed over the gate oxide layer 14. This nitride layer 16 is patterned and etched using traditional lithography techniques (not shown), resulting in alternating nitride pillars 16a and holes 16b. As will be seen, the pillars 16a correspond to the eventual location of CNT FET drains, while the holes 16b correspond to the eventual location of CNT FET sources. As shown, and as is preferred, the pillars 16a and holes 16b are patterned in accordance with the lithography process's minimum linewidth, λ, although this is not required. Furthermore, if desired, the nitride pillars 16a can be further reduced in lateral dimension (i.e., "trimmed") after patterning by exposing the pillars 16a to an isotropic nitride etch, such as a wet etch. Such alternative geometries for the nitride layer 16 will ultimately affect the size and shape of the resulting CNT FET, as will become obvious.

Figure 2:
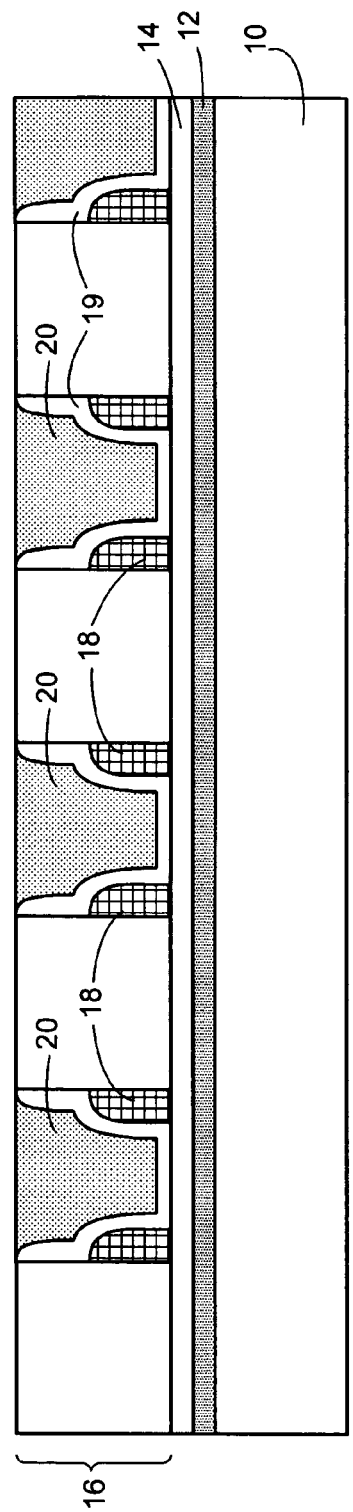

Next, and referring to FIG. 2, metal gates 18 are formed on the sidewalls of the holes 16b. As will be seen, the gates 18 will ultimately comprise the gates of the CNT FET. The gates 18 are formed as sidewall spacers, using traditional conformal deposition and anisotropic etch back techniques. If desired, an isotropic or anisotropic finishing etch can be used to recess the tops of the gates 18 below the tops of the nitride pillars 16a. The gates 18 may be formed of any number of suitable conductive materials, such as polysilicon, tungsten, titanium, tantalum, nickel, cobalt, platinum, ruthenium, and conductive oxides or nitrides of such materials, etc.

After formation of the gates 18, a blanket film of a dielectric, such as an oxide, is deposited, which is followed again by a sidewall spacer etch, resulting in oxide spacers 19 as shown. As will be seen, the oxide spacers 19 comprise a potion of the insulation for the gates 18. If desired, this process can be repeated to build up the oxide film on the tops of the gates 18, which can improve gate isolation as well as manufacturing tolerances.

Next, polysilicon is deposited so as to fill up the remaining spaces in the holes 16b, and the resulting structure is planarized, for example, using Chemical Mechanical Planarization (CMP) techniques. This results in the formation of polysilicon plugs 20 in the holes 16b, as shown in FIG. 2.

Figure 3:
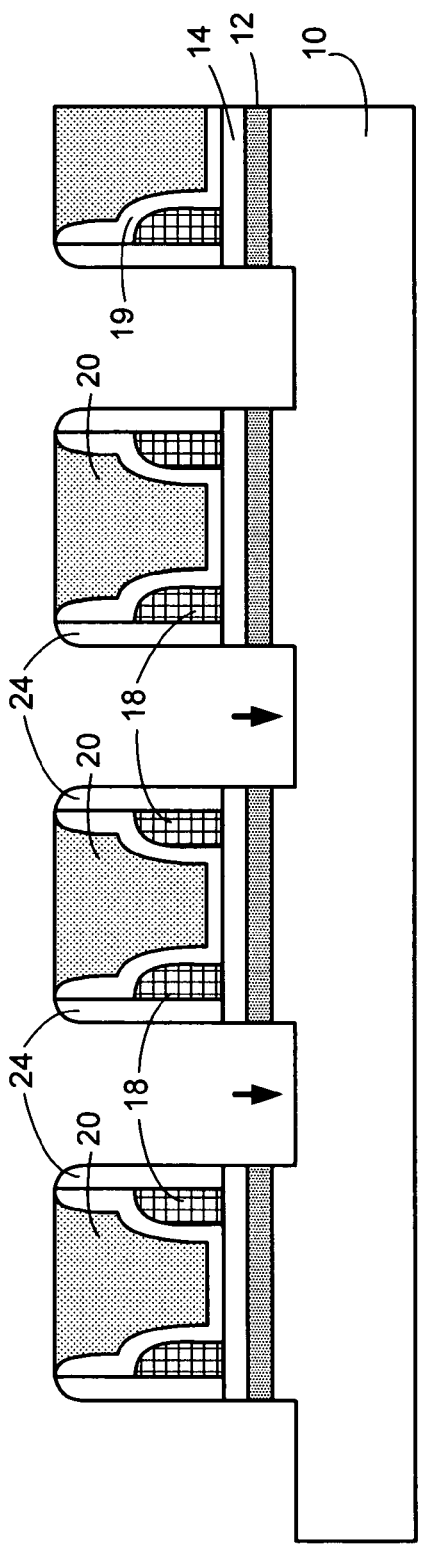

Next, and referring to FIG. 3, the nitride pillars 16a are removed, and another oxide deposition/anisotropic etch back process is performed to form oxide spacers 24 on the edges of the resulting structure. Like the oxide spacers 19 on the other sides of the gates 18, the oxide spacers 24 provide gate isolation and manufacturing tolerance as will be appreciated later in the process flow. During the anisotropic etch back, i.e., during formation of the spacers 24, it is preferred to overetch such that the gate oxide 14, the CNT layer 12, and some portion of the underlying substrate 10 are removed, as shown by the arrows in FIG. 3. If necessary, the etch chemistry can be changed during the overetch to better remove the CNT layer 12, such as by using a dry $O_2$— containing plasma etch to remove that layer. Such overetching exposes the edges of the CNT layer 12, which as will be seen allows the CNT layer 12 to establish electrical contact with conductive source regions (not yet shown). At this point in the process, to improve electrical contact between the edges of the CNT layer 12 and the to-be-formed source region, the oxide layers surrounding the CNT layer 12 (e.g., substrate 10 and gate oxide 14, and the oxide spacers 24 are preferably recessed to better expose the edges of the CNT layers 12, as is explained in the above-incorporated '433 application. Such recessing can be achieved via any number of known plasma or wet isotropic etches.

Figure 4:
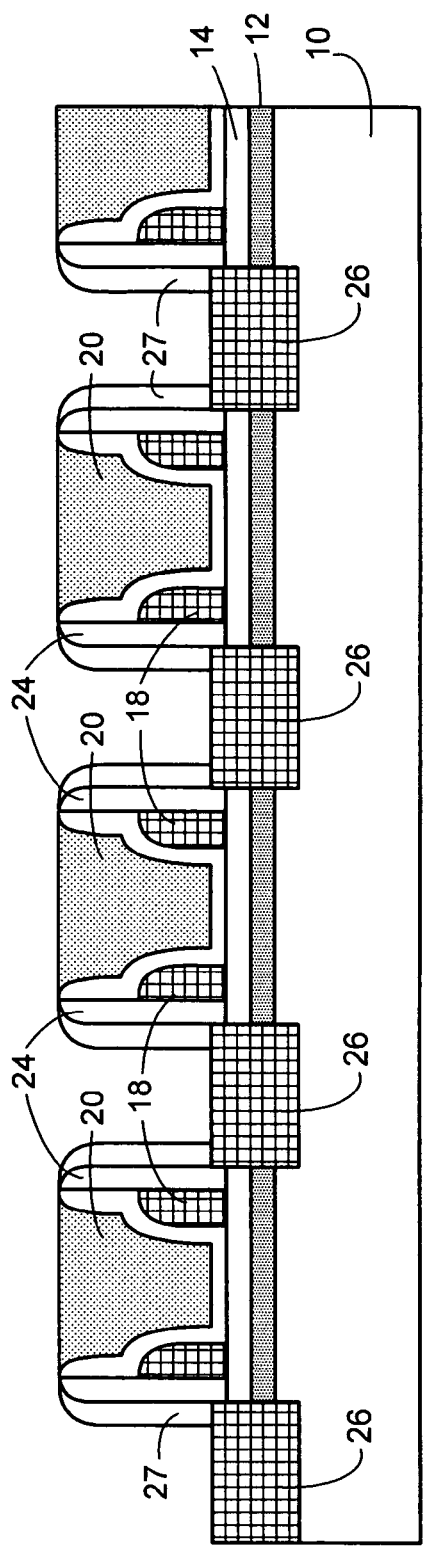

Referring now to FIG. 4, the source regions 26 are provided in the recess formed by the overetch. The source regions 26 are conductive, and can be comprised of any suitable conductive materials, such as those already mentioned for the gates 18. Given the aspect ratio of the recesses, in a preferred embodiment, the conductive material for the source regions 26 is deposited using a directional deposition process, followed by an etchback to clear remaining conductive material from any sidewalls. Such directional deposition processes are well known, and hence are not further discussed. Alternatively, conformal deposition followed by etchback can be used to form the source regions 26. Or, bottom selective CVD deposition processes can be used to up fill the source trenches, and/or ALD or plating could be used as well. In any event, after source region 26 formation, nitride spacers 27 are formed on the remaining vertical surfaces, again using standard conformal deposition and anisotropic etch back techniques.

At this point in the process, the remaining recesses above the source regions 26 in FIG. 4 can be filled with a conductive film to form a plug contact to the source regions 26. For example, such a source plug could at this point comprise a bit line for a DRAM. However, such plug formation is not shown at this point for simplicity, and instead it will be formed in a later step in the process.

Figure 5:
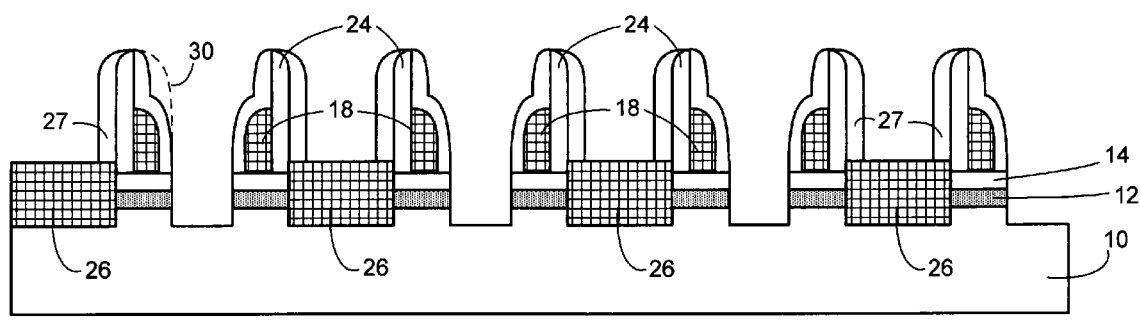
Figure 6:
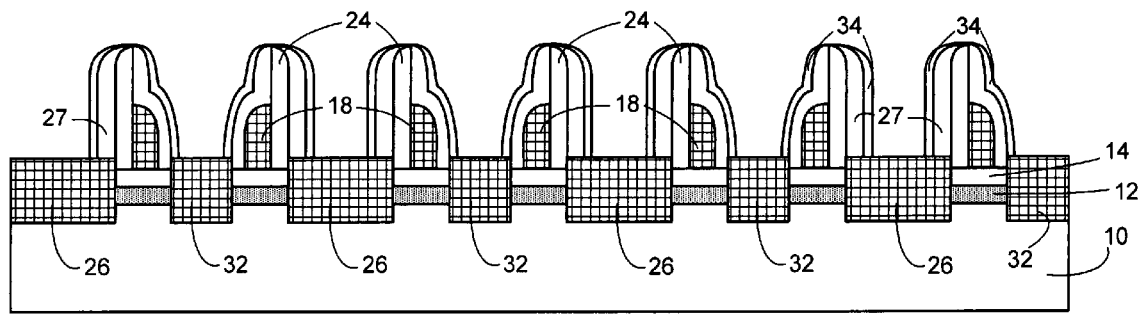

Referring next to FIGS. 5 and 6, the drain regions 32 for the CNT FET are formed, which employs processes similar or identical to those used to form the source regions 26. First, as shown in FIG. 5, the polysilicon plugs 20 are removed, and another overetch is performed into the gate oxide 14, CNT layer 12, and the substrate 10. Prior to this overetch, if desired, an additional oxide spacer 30 can be formed as shown in dotted lines in FIG. 5 to build up the dielectric isolation around the gates 18, although such additional spacer material is not shown in subsequent Figures for simplicity. As when the source overetch was performed, the drain overetch can be accompanied by an isotropic recessing etch to better expose the edges of the CNT layers 12 to improve electrical contact to the drain regions formed in FIG. 6.

A directional metal deposition process is used to form drain regions 32. As with formation of the source regions 26 as described earlier, this deposition process is preferably followed by an etchback to clear remaining conductive material from any sidewalls. This process step may cause additional conductive materials to be formed on top of the previously-formed source regions 26, although this is not detrimental, and is not shown for clarity. As before, after drain region 32 formation, an additional nitride spacer 34 is preferably formed on the vertical edges of the resulting structures, which provides additional isolation for the gates 18.

Figure 7:
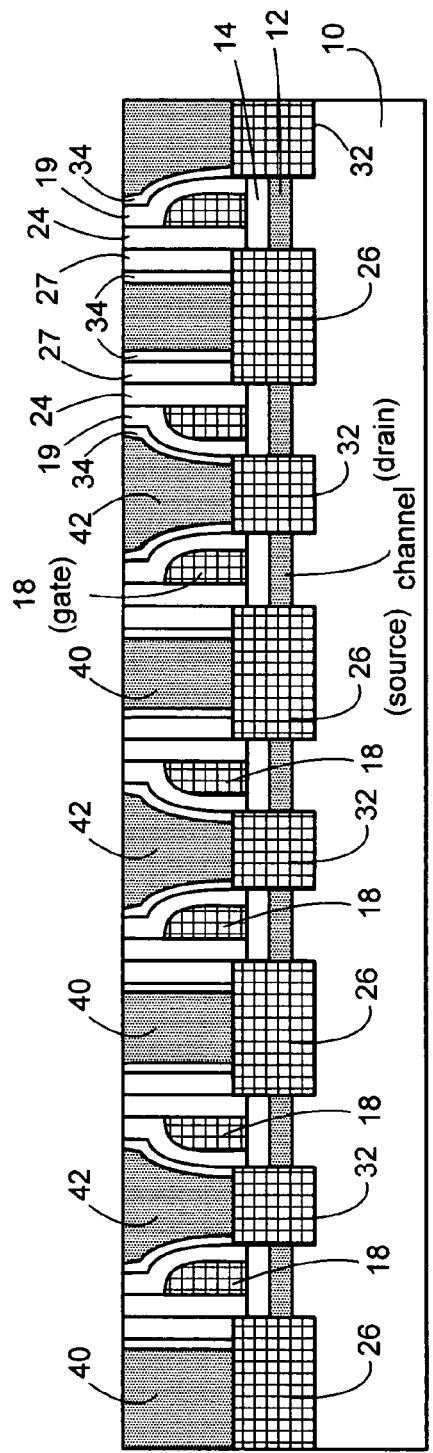
Figure 8:
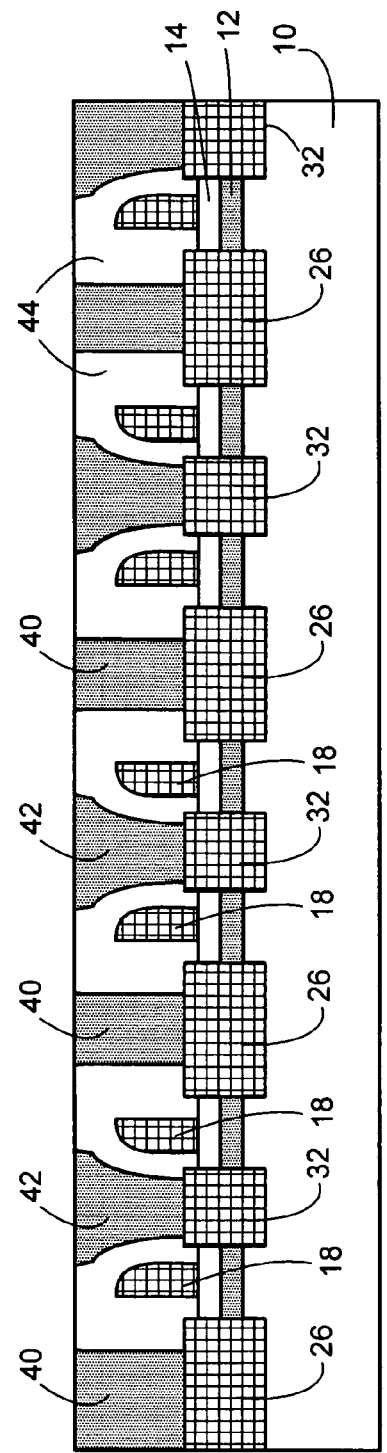

At this point, the CNT FET is formed, complete with a CNT channel, a source 26 and drain 32 coupled to either end of the channel, and an insulated gate 18 above the channel, as shown in FIG. 7. (In FIG. 8, the various dielectric layers 34, 19, 24 and 27 are shown as a single dielectric layer 44 for convenience). In other finishing steps to facilitate later completion of a working integrated circuit, and as shown in FIG. 7, a conductive material can be deposited on the resulting structure (i.e., of FIG. 6) and planarized, resulting in source and drain plug contacts 40, 42 that are self-aligned respectively to the source regions 26 and to the drain regions 32. (Of course, if source plug contacts were made earlier, i.e., after the steps shown in FIG. 4, they would not need to be made at this stage). Although not shown, one skilled in the art will understand that in a useful circuit a contact would also ultimately be made to the gates 18, although such contacts can occur at a different cross sectional depth and hence are not shown. Other typical steps to finish the integrated circuit, such as patterning the interconnect metallization which would overlie the plug contacts 40, 42, passivating the integrated circuit with one or more dielectrics, etc., are not shown.

As noted earlier, the deposition of the CNT layer 12 causes the carbon nanotubes to lie generally parallel to the plane of the substrate 10, but otherwise with a random orientation. Due to the randomness of the orientation of the carbon nanotubes, some of tubes will be in a proper orientation with respect to the source and drain regions 26, 32. Specifically, those tubes having ends terminating in both of the regions can act as modulatable channel conductors. Other nanotubes not having both ends terminating at the source and drain cannot comprise channel conductors. In any event, because some percentage of the nanotubes will contribute to channel conduction in each transistor, the various transistors formed should be of acceptable uniformity and relatively equal in terms of source-to-drain current performance, despite the randomness of the orientation of the nanotubes. This is explained further, and graphically, in the above-incorporated '433 application. Of course, the invention will work with any CNT deposition techniques which provide oriented CNTs in a particular direction parallel to the channel.

The resulting CNT FETs are very dense, and can result in a linear device density of two transistors per 1f feature size, i.e., twice the linear density (or four times the area density) of traditional CMOS circuitry. Such high device density is especially useful for fabricating large circuits, and in particular large logic circuits. Moreover, if combined with pitch multiplication or other known techniques, even higher linear densities (e.g., four transistors per 1f feature size) can be obtained. While the disclosed process for forming the CNT FETs allows many such transistors to be built in close proximity, this is of course not required; instead, individual CNT FETs could also be built using the process.

Figure 9:
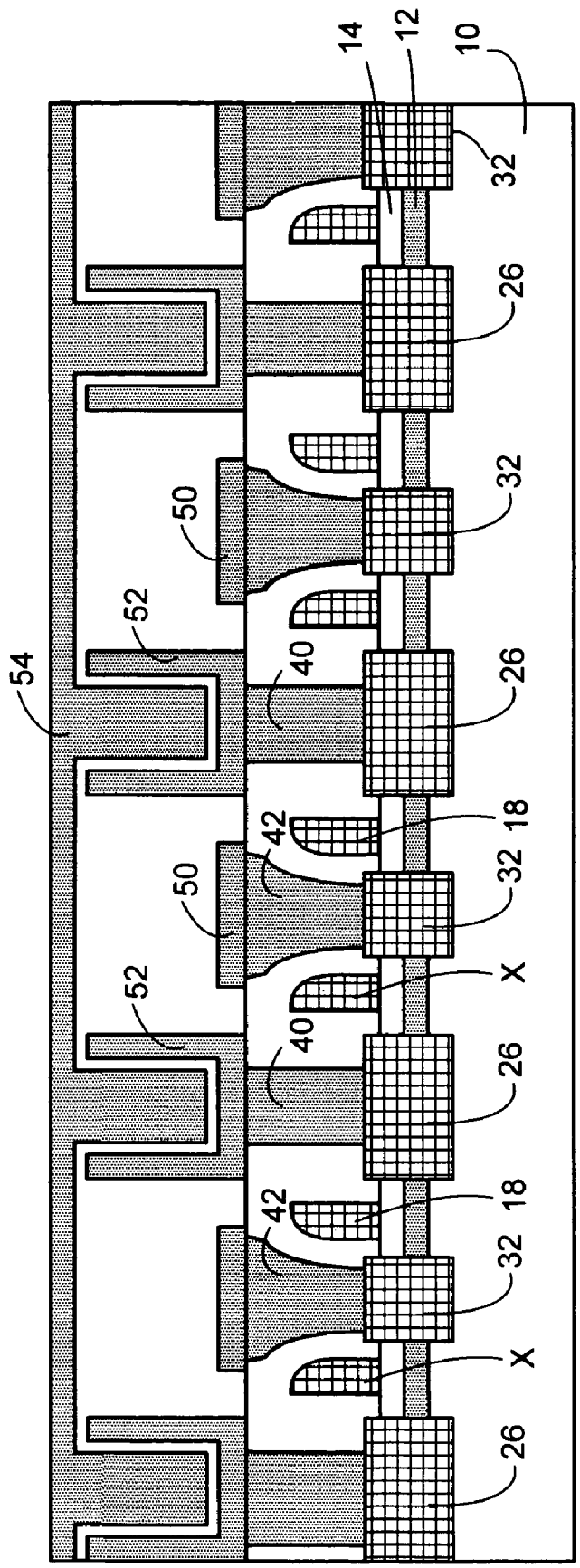
FIG. 9 illustrates how the CNT FETs fabricated as shown in FIGS. 1-8 can be used to form a memory array, in particular, a DRAM memory array.

The close proximity of the CNT FETs makes the disclosed process particularly useful in the construction of memory arrays, and a cross section of one such array is disclosed in FIG. 9. Specifically, FIG. 9 illustrates the CNT FETs as used in a DRAM array. As can be seen, bit lines 50 have been patterned and etched in a manner to allow them to communicate with the drain plug contacts 42. The source plug contacts 40 in turn communicate with the lower plate of a capacitor 52, which is shown formed as a container capacitor, in accordance with well known DRAM manufacturing techniques. A top common capacitor plate 54 is then formed over and within the lower plates 52 to form the capacitor on which charge is stored. When constructed in this manner, note that only half of the gates 18 are active, i.e., to promote charge transfer between adjacent sources and drains of the DRAM cells. Specifically, those gates marked with an X are not active, meaning they are simply not connected to any signal via a suitable overlying contact. Of course, if the cells are straddled as is common in DRAM architectures, those gates marked X could be active for cells at different depths in the cross section (not shown). Of course, the disclosed process can also be used for manufacturing standard logic circuits as well.

As explained in the above-incorporated '433 application, it can be beneficial to position the gate 18 of the CNT FET asymmetrically over the channel with respect to the source and drain. Specifically, it is preferred to position the gate closer to the source and further from the drain to mitigate problems with off-current leakage of the CNT FET. Such asymmetric adjustment of the gate is easily achieved with the disclosed process by tailoring the thickness of the dielectric layers 19 (which, as is best seen in FIG. 7, determines gate-to-drain spacing) and 24 (which determines gate-to-source spacing).

As the literature makes clear, CNT FETs can be made with single-walled carbon nanotubes, or with multi-walled nanotubes (i.e., tubes within a tube and/or coiled sheets of carbon), and use of the disclosed techniques are likewise adaptable to the use of both types of nanotubes. Both types of tubes (single- or multi-walled) have different electrical properties, and the use of each can be benefited by the disclosed techniques by simply varying the CNT starting material (e.g., in the spin-on solvent). In fact, mixtures of single- and multi-walled carbon nanotubes could be used to fabricate a single transistor.

Moreover, the technique and transistor design disclosed herein are adaptable to the use of transistors which employ a single carbon nanotube as the conduction medium between the source and the drain. Of course, and as the above-incorporated references make clear, should a single nanotube be used as the conduction medium, the disclosed techniques would need to be logically altered to locate such singular nanotubes at proper locations on the substrate 10. Techniques are known for such single carbon nanotube placement.

It should be noted that reference to transistor terminals "source" and "drain" are synonymous in the context of an FET. Moreover, while the disclosed design and processing techniques are particularly useful to CNT FETs, the disclosed design and processing techniques can also be applied to the formation of regular FETs as well, e.g., those that have semiconductive (silicon) channels and substrates.

It should be understood that the inventive concepts disclosed herein are capable of many modifications. To the extent such modifications fall within the scope of the appended claims and their equivalents, they are intended to be covered by this patent.

What is claimed is:

1. A method for forming carbon nanotube transistors, comprising:
   starting with a substrate comprised of a bottom dielectric, a carbon nanotube layer, and a top dielectric;
   forming alternating pillars on the top dielectric, the alternating pillars defining pillar regions and hole regions;
   forming gates for the transistors on the sidewalls of the pillars in the hole regions;
   forming sources in between the gates in the hole regions and in contact with the carbon nanotube layer;
   removing the pillars; and
   forming drains in between the gates in the pillar regions and in contact with the carbon nanotube layer.

2. The method of claim 1, wherein the carbon nanotube layer comprises a plurality of carbon nanotubes.

3. The method of claim 1, wherein sources and drains are self aligned with respect to the gate.

4. The method of claim 1, further comprising forming dielectric sidewalls on edges of the gates prior to forming the sources and drains.

5. The method of claim 1, wherein forming the sources and drains comprises etching recesses through at least the top dielectric and the carbon nanotube layer and depositing a conductive material in the recesses.

6. The method of claim 1, further comprising forming plug contacts to the sources and drains that are self aligned to the gates.

7. A method for forming a carbon nanotube transistor, comprising:
- starting with a substrate comprised of a bottom dielectric, a carbon nanotube layer, and a top dielectric;
- forming a pillar on the top dielectric;
- forming a gate for the transistor on the sidewall of the pillar, the gate having an outer edge and an inner edge relative to the sidewall of the pillar;
- forming a source proximate to the outer edge of the gate and in contact with the carbon nanotube layer;
- removing the pillar; and
- forming a drain proximate to the inner edge of the gate and in contact with the carbon nanotube layer.

8. The method of claim 7, wherein the carbon nanotube layer comprises a plurality of carbon nanotubes, wherein ends of the plurality of carbon nanotubes are in contact with the source and the drain.

9. The method of claim 7, wherein source and drain are self aligned with respect to the gate.

10. The method of claim 7, further comprising forming dielectric sidewalls on the edges of the gate prior to forming the source and drain.

11. The method of claim 7, wherein forming the source and drain comprises etching recesses through at least the top dielectric and the carbon nanotube layer and depositing a conductive material in the recesses.

12. The method of claim 7, further comprising forming plug contacts to the source and drain that are self aligned to the gate.

13. A method for forming a carbon nanotube transistor, comprising:
- forming a channel of at least one carbon nanotube on a substrate;
- forming a dielectric over the channel;
- defining a gate over the dielectric, wherein the gate comprises a spacer having a first edge and a second edge;
- masking the dielectric proximate to the first edge;
- etching the dielectric proximate to the second edge to expose a portion of the channel;
- forming a source region in contact with the exposed portion of the channel proximate to the second edge;
- masking the dielectric proximate to the second edge;
- etching the dielectric proximate to the first edge to expose a portion of the channel; and
- forming a drain region in contact with the exposed portion of the channel proximate to the first edge.

14. The method of claim 13, wherein the carbon nanotube layer comprises a plurality of carbon nanotubes, wherein ends of the plurality of carbon nanotubes are in contact with the source and the drain.

15. The method of claim 13, wherein source and drain are self aligned with respect to the gate.

16. The method of claim 13, further comprising forming dielectric sidewalls on the edges of the gate prior to forming the source and drain.

17. The method of claim 13, further comprising forming plug contacts to the source and drain that are self aligned to the gate.

* * * * *